United States Patent [19]

Omura et al.

[11] Patent Number: 5,714,391
[45] Date of Patent: Feb. 3, 1998

[54] METHOD OF MANUFACTURING A COMPOUND SEMICONDUCTOR THIN FILM FOR A PHOTOELECTRIC OR SOLAR CELL DEVICE

[75] Inventors: Kuniyoshi Omura, Ikoma; Tsuyoshi Nishio, Nishinomiya; Satoshi Shibutani, Moriguichi; Shigeo Kondoh, Hirakata; Mikio Murozono, Hirakata; Akira Hanafusa, Hirakata; Hideaki Oyama, Neyagawa, all of Japan

[73] Assignee: Matsushita Electric Industrial Co., Ltd., Japan

[21] Appl. No.: 648,544

[22] Filed: May 16, 1996

[30] Foreign Application Priority Data

| May 17, 1995 | [JP] | Japan | 7-118167 |
| Sep. 6, 1995 | [JP] | Japan | 7-228775 |
| Jan. 29, 1996 | [JP] | Japan | 8-012550 |

[51] Int. Cl.⁶ .............................................. H01L 31/18
[52] U.S. Cl. .............. 437/5; 136/260; 136/264; 136/265; 136/244; 427/74; 427/226; 427/255.2; 437/102; 437/234
[58] Field of Search ................ 136/260, 264, 136/265; 257/184; 437/5, 234, 102; 427/74, 226, 248.1, 255.2, 372.2

[56] References Cited

U.S. PATENT DOCUMENTS

| 4,360,542 | 11/1982 | Loeffler et al. | 427/75 |
| 4,611,091 | 9/1986 | Choudary et al. | 136/260 |
| 4,734,381 | 3/1988 | Mitchell | 437/5 |
| 4,975,299 | 12/1990 | Mir et al. | 427/51 |
| 5,304,499 | 4/1994 | Bonnet et al. | 437/5 |
| 5,393,675 | 2/1995 | Compaan | 437/5 |

FOREIGN PATENT DOCUMENTS

| 56-28386 | 7/1981 | Japan | 136/260 |

OTHER PUBLICATIONS

Pande et al., "Electrophoretically Deposited CdTe Films and CdS-CdTe Devices", 13th European Photovoltaic Solar Energy Conference and Exhibition; Nice, France. Oct. 23, 1995–Oct. 27, 1995.

Kessler et al., "Characterization of High Vacuum Evaporated CdTe/CdS Layers and Solar Cells", 13th European Photovoltaic Solar Energy Conference and Exhibition; Nice, France Oct. 23, 1995–Oct. 27, 1995.

Chu et al., "Recent Progress in Thin-film Cadmium Telluride Solar Cells", *Progress in Photovoltaics: Research and Applications*, vol. 1, pp. 31–42 (1993).

*Primary Examiner*—Aaron Weisstuch
*Attorney, Agent, or Firm*—Ratner & Prestia

[57] ABSTRACT

This invention relates to a manufacturing method of a compound semiconductor thin film derived from a metal sulfide produced by thermal decomposition of a sulfur-containing metal organic compound, the compound containing at least one functional group having at least one metal atom selected from the group consisting of copper, zinc, cadmium, mercury, and lead, and the functional group also containing at least one sulfur atom. Since the obtained metal sulfides are of high-purity and dense, they can be utilized in various photoelectric devices. Particularly, the photoelectric conversion efficiency of a CdS/CdTe system thin film compound semiconductor solar cell can be improved remarkably by employing a layer made of a CdS thin film as a window of the solar cell.

15 Claims, 3 Drawing Sheets

METHOD OF MANUFACTURING A COMPOUND SEMICONDUCTOR THIN FILM FOR A PHOTOELECTRIC OR SOLAR CELL DEVICE

FIELD OF THE INVENTION

This invention relates generally to a method of forming compound semiconductor thin films, and particularly to photoelectric devices using the compound semiconductor thin films, and methods of manufacturing the devices.

BACKGROUND OF THE INVENTION

Compound semiconductors consisting of metal sulfides such as copper sulfide (CuS), cadmium sulfide (CdS), mercury sulfides (HgS), lead sulfide (PbS), etc., have been used extensively for photoelectric device materials in the photoelectric device industry. For example, a CdS thin film has been used to construct a photoconductive sensor by utilizing the change of electrical resistance caused by the irradiation of light on an optical filter.

Various manufacturing methods of CdS/CdTe compound semiconductor solar cells comprised of the films of cadmium sulfide (CdS) and cadmium telluride (CdTe) have been reported. A practical method of manufacturing the solar cells in which the entire film forming processes are carried out by printing and sintering has been disclosed in Japanese Patent Publication No. Sho 56-28386.

Traditionally, the printing and sintering method and the chemical bath deposition method have been well known in the formation of CdS films. In the process of the conventional printing and sintering method, a paste is produced by mixing and kneading fine particles of CdS, with a powder of cadmium chloride ($CdCl_2$), acting as a flux or sintering agent, and propyleneglycol (PC) acting as a dispersive medium. This paste is then coated on a substrate in the form of a film by a screen printing method, dried, and sintered.

This method is highly advantageous because of the relatively low cost of its manufacturing equipment, excellent reproducibility, and the ability to continuously produce CdS layers having a relatively large area and having a desired shape and size. However, it is necessary to use a substrate having a high heat resistance and chemical stability, such as a ceramic sheet of alumina or a barium borosilicate glass, because of the required high sintering temperature of about 700° C.

Moreover, the method is definitely disadvantageous for mass production since the sintering has to be performed in an inert atmosphere, such as nitrogen gas, and the coated substrate has to be processed within an expensive ceramic case in order to suppress the evaporation of $CdCl_2$ within the CdS paste, and the sintering period required is often greater than 2 hours.

Furthermore, the sintered CdS layer is a thick film having an uneven thickness in the range of 20–60 μm and a number of void spaces or pinholes. This layer can hardly be considered a homogeneous layer, and the adhesion strength between the CdS layer and the substrate is not adequate. In addition, a high photoelectric conversion efficiency cannot be obtained from a photoelectric conversion device or a solar cell made of a thick CdS layer because of low light transmittance.

Since the degree of pulverization of CdS powder is limited to a particle size of 2–4 μm, the printing and sintering method applicable to the thinner CdS layer deposited by this method is also limited to the extent that the particles are used in the conventional method.

The chemical bath deposition method is a method in which the CdS layer is deposited on a substrate immersed in a solution containing dissolved compounds of cadmium (Cd) and sulfur (S). Although a CdS thin film having a large area can be obtained by this method, the obtained CdS film can hardly be considered to be a homogenous fill. Moreover, since the deposition does not occur only on a desired and limited area, the area unrelated to the deposition such as the back of the substrate, for example, must be excluded from the deposition in advance by applying a mask thereon before the deposition. Alternatively, the cleaning of vessels and equipment has to be carded out before each deposition process, or the solution has to be renewed. Therefore, this method had been considered to be impracticable as applied to the high speed continuous production of CdS film.

In addition to these methods, the forming of compound semiconductor fills by vacuum evaporation, sputtering, and CVD methods has been known, and by using any of these methods, the desired film property and film thickness can be obtained. However, since all of these methods have to be conducted in a vacuum chamber, these are not suitable to the high-speed continuous deposition of large area and uniform thinfilms. If the investments for enabling the deposition of thin films by any of these methods were made, the amount necessary for this large scale and complex equipment would be prohibitively high.

SUMMARY OF THE INVENTION

The present invention solves not only the problems involved in the conventional methods but also offers a new method of depositing uniform semiconductor thinfilms. Moreover, various photoelectric devices made of metal sulfides by means of a method of producing a compound semiconductor thin film are offered, and low cost solar cells having high photoelectric conversion efficiencies using CdS thin film as a window layer are offered.

This invention offers a method of continuously producing uniform and large area compound semiconductor thin films such as metal sulfide, using relatively low-cost production equipment operated in a normal atmospheric condition without using conventional and expensive vacuum devices and an atmosphere of high-temperature inert-gas such as nitrogen.

Namely, a new method is offered to deposit compound semiconductor thin films derived from metal sulfides obtained by applying a thermal decomposition process to a sulfur-containing metal organic compound, the compound containing at least one functional group having at least one metal atom selected from the group consisting of copper, zinc, cadmium, mercury, and lead, the functional group also containing at least one sulfur atom.

The present invention also offers photoelectric devices made of compound semiconductor thin films, such as the film of a metal sulfide produced by the above-mentioned manufacturing method, deposited on a conductive electrode of the thin film forming substrate. Furthermore, low cost solar cells of compound semiconductor films having a high photoelectric conversion efficiency using the CdS layer as a window layer manufactured by the invented manufacturing method are also offered.

DETAILED DESCRIPTION OF THE PREFERRED EMBODIMENTS

The details of the present invention are described below by referring to the attached drawings and tables.

EXAMPLE-1

A paste is prepared by first adding and mixing one liter of dispersive medium PG (propyleneglycol) into a volume of 1.75 mol of cadmium diethyl dithiocarbamate powder, which is a metal organic compound. This paste is then coated on a surface of a glass substrate at a surface density of 6.4 mg/cm$^2$ in a predetermined pattern prepared by means of a screen printing method. The substrate and paste are heated to a temperature of 120° C. in order to evaporate the dispersive medium, thereby obtaining a metal organic compound supplying substrate.

Figure 1:
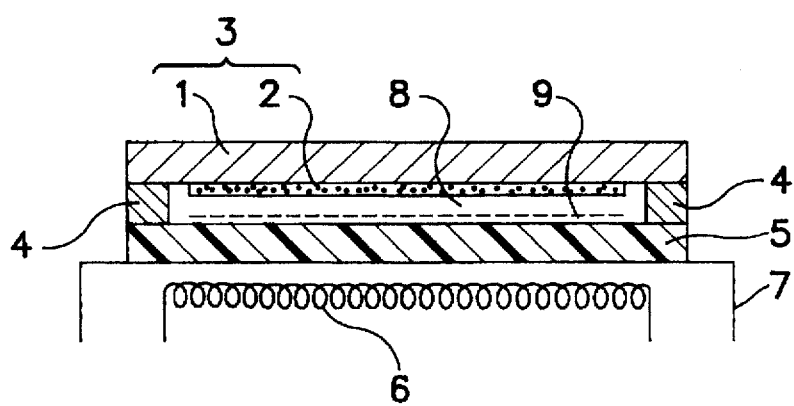
FIG. 1 is a schematic drawing of an exemplary device for depositing the compound semiconductor thin films according to the present invention.

Additionally, a thin film forming substrate is prepared consisting of a transparent conductive electrode made of a 200 nanometer (nm) thick indium-tin oxide (ITO) film deposited on a surface of soda lime glass plate. Then, a CdS thin film is formed by using the compound semiconductor film deposition device according to the present invention, as shown in FIG. 1. By using the device shown in FIG. 1, the metal organic compound supplying substrate 3, consisting of glass plate 1 on which cadmium diethyldithiocarbamate 2 is coated, is disposed on thin film forming substrate 5 made of soda-lime glass on which a transparent conductive film is deposited, and is fixed through spacer 4 holding a gap space of 1.0 mm.

Next, thin film forming substrate 5 is placed on heating plate 7, containing integral heating wire 6, and is heated to a temperature of 450° C. Thus, metal organic compound supplying substrate 3, which faces thin film forming substrate 5 at a close distance, is heated by thermal radiation from heated thin film forming substrate 5, thereby bringing the temperature of the metal organic compound supplying substrate 3° to 300° C.

The coated cadmium diethyldithiocarbamate 2 having a melting point of 250° C. is melted, evaporated, and deposited on the electrode predeposited on thin film forming substrate 5. This thermal decomposition results in the growth of a CdS crystal thin film 9 having a thickness of 70 nm.

Table 1 shows the results of measurements for determining the optical bandgaps of CdS thin films obtained by changing the type of cadmium organic compound deposited on the metal organic compound supplying substrate 5 while adjusting the distance between the thin film forming substrate 3 and the metal organic compound supplying substrate 5 and changing the temperature of metal organic compound supplying substrate 5. All of these thin film depositions have been conducted in a normal atmospheric condition without using inert-gas which is required in thin film deposition made by a conventional printing and sintering method.

As shown in Table 1, the optical bandgaps of CdS thin films deposited by thermal deposition on a thin film forming substrate by evaporating various cadmium organic compounds are in a range of 2.41–2.47 eV. This range coincides with the value of 2.42 eV which is the conventionally known standard value, thereby proving the formation of high-quality CdS thin films with very few lattice defects.

All of the X-ray diffraction analyses performed on these CdS films showed peaks of the (002) face, thus proving that these are hexagonal CdS crystals. Furthermore, the X-ray photoelectron spectroscopic analyses performed on the Cd-S bonds of the CdS thin films have shown a coincidence of these bonds with the Cd-S bond in the CdS single crystal. Moreover, when this CdS thin film is used as a window layer of a compound semiconductor solar cell, the content of the carbon element causing a negative effect on the characteristics of the solar cell can be determined by using the X-ray photoelectron spectroscopic analyzer.

TABLE 1

| Type of Cd organic compound | Temp. of metal organic compound supplying substrate (°C.) | Temp. of film forming substrate (°C.) | Optical bandgap (ev) | |
|---|---|---|---|---|
| | | | Standard | Measured |
| Cadmium diethyl dithiocarbamate | 300 | 450 | 2.42 | 2.42 |
| Cadmium diethyl- dithiocarbamate | 330 | 440 | 2.42 | 2.44 |
| Cadmium dibutyl- dithiocarbamate | 270 | 440 | 2.42 | 2.41 |
| Cadmium dibenzyl- dithiocarbamate | 320 | 440 | 2.42 | 2.45 |
| Cadmium mercaptide | 360 | 440 | 2.42 | 2.44 |
| Cadmium thioate | 320 | 440 | 2.42 | 2.43 |
| Cadmium dithioate | 270 | 440 | 2.42 | 2.46 |
| Cadmium thio-carbonate | 240 | 440 | 2.42 | 2.45 |
| Cadmium dithio-carbonate | 300 | 440 | 2.42 | 2.43 |
| Cadmium tri-thiocarbonate | 320 | 440 | 2.42 | 2.42 |
| Cadmium thio-carbamate | 310 | 440 | 2.42 | 2.47 |

Figure 2:
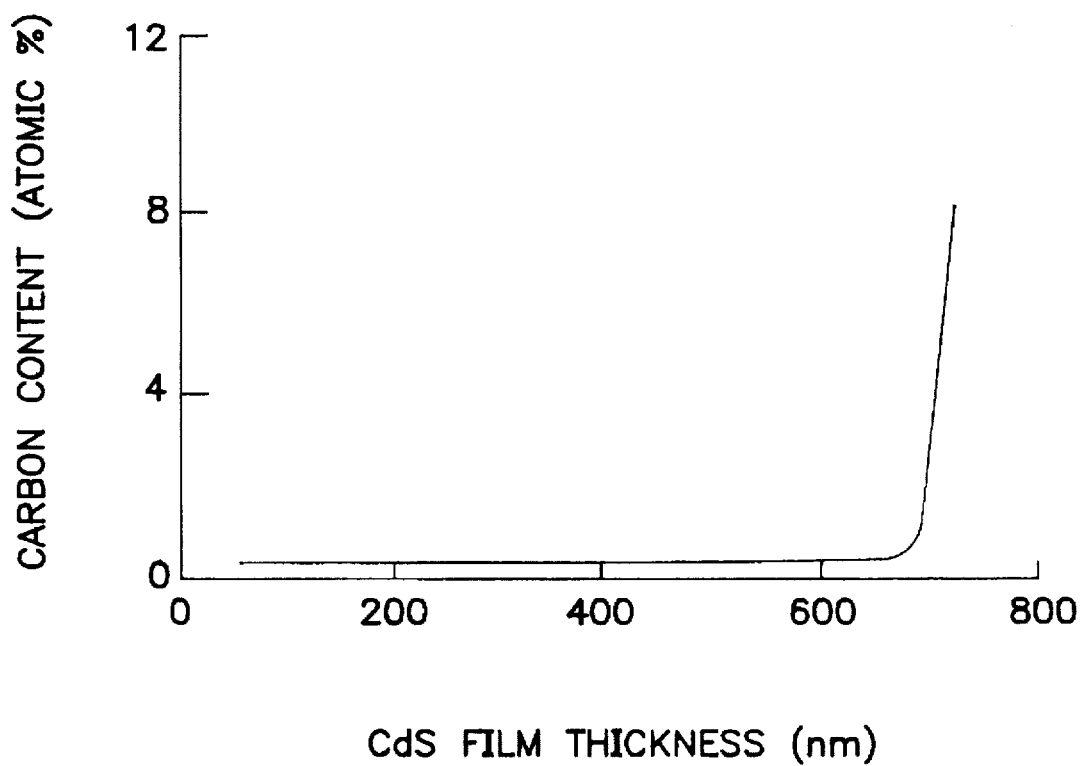
FIG. 2 is a graph showing the relationship between the thickness of a CdS thin film and the carbon content therein.

The thickness of the CdS thin film is adjustable by controlling the heating period of the metal organic compound supplying substrate. The carbon content in the CdS thin film having various thicknesses is shown in FIG. 2. FIG. 2 shows a remarkable increase of carbon content when the thickness of the CdS is more than 700 nm. Therefore, the CdS thin film used as a window layer of a compound semiconductor solar cell should be less than 700 nm thick.

In the deposition device of a compound semiconductor thinfilm as shown in FIG. 1, when space 8, provided between the metal organic compound supplying substrate 3 and the thin film forming substrate 5, is in a closed condition, CdS thin film 9 is deposited on the entire exposed surface of thin film forming substrate 5.

On the other hand, the CdS thin film 9 is deposited on a pattern nearly the same as the pattern of metal organic compound layer 2, coated on the metal organic compound supplying substrate 3, when space 8 between substrates is in a non-closed condition. In other words, the CdS thin film pattern can be adjusted into a desired pattern by adjusting the pattern of coated metal organic compound layer.

Since the temperatures of evaporation and thermal decomposition of various cadmium organic compounds are less than the softening temperature of soda-lime glass, there is no need to use expensive heat resisting glass such as the barium borosilicate glass employed in the conventional printing and sintering method. Although not shown in Table 1, high quality CdS thin films can also be obtained when various cadmium organic compounds are mixed in use.

EXAMPLE-2

As in Example-1, various compound semiconductor thin films made of various metal sulfides can be derived by using various metal organic compounds, excluding cadmium, by using the thin film deposition device shown in FIG. 1. The characteristics of these fills are identified by using the analyzing method shown in the case of Example-1. Table 2 shows the determined optical bandgaps of various metal sulfide thin films.

As shown in Table 2, since the determined optical bandgaps of various metal sulfide thin films are nearly the same as the respective standard values, this proves that this method produces deposition of high-quality metal sulfide thin films with few lattice defects.

Although not shown in Table 2, a high-quality zinc-cadmium sulfide thin film can be obtained even when the zinc diethyldithiocarbamate and the cadmium diethyldithiocarbamate are homogeneously mixed at a predetermined ratio. This mixture is coated on a metal organic compound supplying substrate by the method shown in Example-1.

TABLE 2

| Type of metal organic compound | Produced sulfide | Temp. of metal organic compound supply substrate (°C.) | Temp. of film forming substrate (°C.) | Optical bandgap (eV) Standard | Optical bandgap (eV) Measured |
|---|---|---|---|---|---|
| Copper diethyl-dithio-carbamate | $Cu_2S$ | 310 | 380 | 1.2 | 1.7 |
| Zinc diethyl-dithio-carbamate | ZnS | 305 | 500 | 3.5 | 3.6 |
| Mercury diethyl-dithio-carbamate | HgS | 250 | 330 | 1.9 | 1.8 |
| Lead diethyl-thio-carbamate | PbS | 330 | 550 | 0.37 | 0.38 |

As explained in Examples -1 and -2, the metal organic compounds applicable to the evaporation and thermal decomposition method according to the present invention can be single substances or mixtures of mercaptide, thioate, dithioate, thiocarbonate, dithiocarbonate, trithiocarbonate, thiocarbamate, and dithiocarbamate of at least one metal element selected from the group consisting of copper, zinc, cadmium, mercury, and lead. In other words, the compounds containing at least one atom of the above-mentioned metal elements combined with at least one sulfur element per molecule, or the compounds containing at least carbon and nitrogen elements besides the metal elements and sulfur element, are applicable.

EXAMPLE-3

Here, cadmium isopropylxanthate, used as a metal organic compound, is dissolved first in an organic solvent of 1-methyl-2-pyrrolidone at a concentration of 1.2 mol/l in order to prepare a solution having an approximate viscosity of 50 centipoise (cP), after the insoluble residue remaining in the solution is removed by a centrifugal separator. The prepared solution of cadmium organic compound is then coated on a transparent electrode made of tin oxide (SnO), disposed on a soda-lime glass plate having a size of 35 cm square at a thickness of about 600 nm by a flexographic printing method. The glass plate and coating are then dried in a normal atmosphere at a temperature of about 110° C. in order to evaporate the solvent.

The substrate on which the cadmium organic compound is coated is heated to a temperature of 450° C. in a normal atmosphere for a period of 3 minutes. This finishes the thermal decomposition of cadmium isopropylxanthate or a cadmium organic compound and results in a uniform thin film having a thickness of 300 nm. This thin film is analyzed by an analyzing method as in Example-1. The analysis reveals that this film is a dense and high-quality CdS thin film and is the same as the one obtained by the evaporation and thermal decomposition of the cadmium organic compound shown in Example-1.

The thermal decomposition reaction produced by the printing and thermal decomposition method according to the present invention as shown in this example results in the dense and high-purity CdS thin film which was obtained by the dispersion and desorption of organic material and the sequential arrangement of dispersed CdS molecules taking place simultaneously on a substrate resulting in the form of a regular CdS lattice.

EXAMPLE-4

In order to obtain a high-quality CdS thin film by the printing and thermal decomposition method according to the present invention as shown in Example 3, a uniform coated layer of cadmium organic compound is prepared on a thin film forming substrate first. The uniformities of various CdS thin films formed by the method of Example-3 when the viscosity of the solution is changed by changing the concentration of the 1-methyl-2-pyrrolidone solution of cadmium isopropylxanthate have been evaluated. The results of these experiments are summarized in Table 3.

When the concentration of the solution is 0.1 mol/l and its viscosity is 3 cP, a blank part is observed in the coated layer of cadmium organic compound prepared by a printing and post drying method. Thus, it is concluded at this stage that a uniform CdS thin fill is impossible to obtain.

When the concentration of the solution is brought to a high level of 2.4 mol/l, its viscosity goes up to a high level of 120 cP, and thus, uniform coating becomes impossible by the flexographic printing method. Therefore, the viscosity of the solution has to be regulated within a range of 5–100 cP, provided the concentration of cadmium isopropylxanthate is regulated in a range of 0.2–2.0 mol/l in order to obtain a uniform and high-purity CdS thin film.

TABLE 3

| Concentration (mol/l) | Viscosity (cP) | Evaluation of CdS Thinfilm |
|---|---|---|
| 0.1 | 3 | No good |
| 0.2 | 5 | Good |

TABLE 3-continued

| Concentration (mol/l) | Viscosity (cP) | Evaluation of CdS Thinfilm |
| --- | --- | --- |
| 0.8 | 10 | Good |
| 1.2 | 50 | Good |
| 2.0 | 100 | Good |
| 2.4 | 120 | No good |

In Examples -3 and -4, the cases of cadmium isopropylxanthate used as a cadmium organic compound have been explained. However, other than this, a simple substance or mixture of cadmium mercaptide, thioate, dithioate, thiocarbonate, dithiocarbonate, trithiocarbonate, thiocarbamate, and dithiocarbamate such as cadmium dibenzylcarbamate, cadmium n-butylxanthate, cadmium thiobenzoate, etc. can also be used. In other words, any compound containing at least one group in which one cadmium atom and at least one sulfur atom are combined, or compounds containing at least one carbon atom and one nitrogen atom besides cadmium and sulfur, are applicable.

Therefore, a high-quality CdS thin film can be obtained by adjusting the concentration of the organic solvent solution of the cadmium organic compound so as to obtain a viscosity of 5–100 cP.

The type of the organic solvent is not limited only to 1-methyl-2-pyrrolidone, as any polyhydric alcohol and their derivatives such as γ-butyrolacetone, tetralin, N,N-dimethylformamide, dimethylsulfoxide, toluene, chloroform, alcohol group and cellosolve (ethylglycol mono-ethylether), and Carbitol (diethyleneglycol mono-ethylether), can be selected and used in the form of a simple substance or mixtures.

It is confirmed that the thickness of the CdS thin film obtained by the printing and thermal decomposition method according to the present invention as described in Examples -3 and -4 should not be more than 700 nm, based on the carbon content in the film when it is used as a window layer of a solar cell made of a compound semiconductor solar cell like the case of CdS fill obtained by the evaporation and thermal decomposition method shown in Example-1.

The cadmium sulfide manufacturing method by which the printing and thermal decomposition of cadmium organic compound is performed has been explained above. It should be noted that high-quality metal sulfide thin films can be obtained from an organic compound containing at least one metal element selected from the group consisting of copper, zinc, cadmium, mercury, and lead, by applying the same method.

Although the flexographic printing method used for coating the organic solvent solution containing a metal organic compound has been described in Examples -3 and -4, the printing method is not necessarily limited to this particular method. Other printing methods including relief printing, intaglio printing, lithography, stencil printing, and screen printing, can be used depending on the desired pattern of the metal sulfide thin film.

EXAMPLE-5

Figure 3:
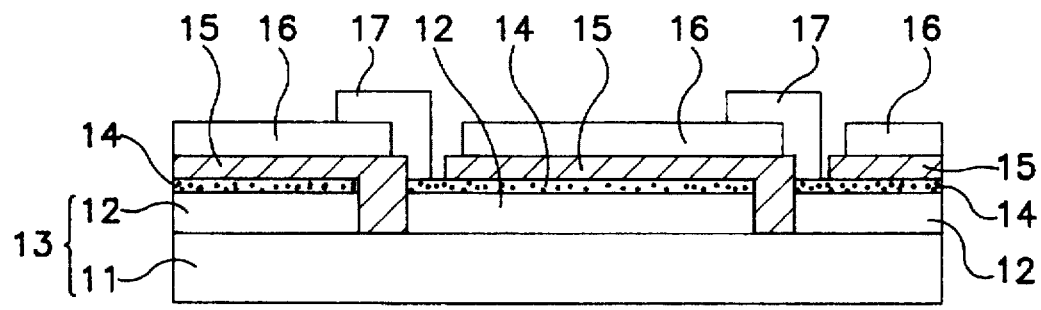
FIG. 3 is a cross-section of an exemplary CdS/CdTe system solar cell made of a compound semiconductor thin film according to the present invention, provided further with a window layer made of a CdS thinfilm.

In Example-1, a solar cell is made of a CdS/CdTe system thin film compound semiconductor as shown in FIG. 3, using a 70 nm thick CdS thin film for its window layer deposited on an ITO electrode formed on a surface of soda-lime glass plate. The characteristics of the solar cell were measured. FIG. 3 shows a CdTe thin film 15 deposited on a CdS thin film 14 by using a proximity sublimation method which is one of the evaporation methods. Here, CdS thin film 14 is formed on ITO film 12 acting as an electrode, disposed on soda-lime glass 11 acting as a thin film forming substrate 13. A solar cell is completed by disposing carbon electrode 16 on CdTe thin film 15, and disposing a Ag-In electrode 17 on both CdS thin film 14 and carbon electrode 16.

Figure 4:
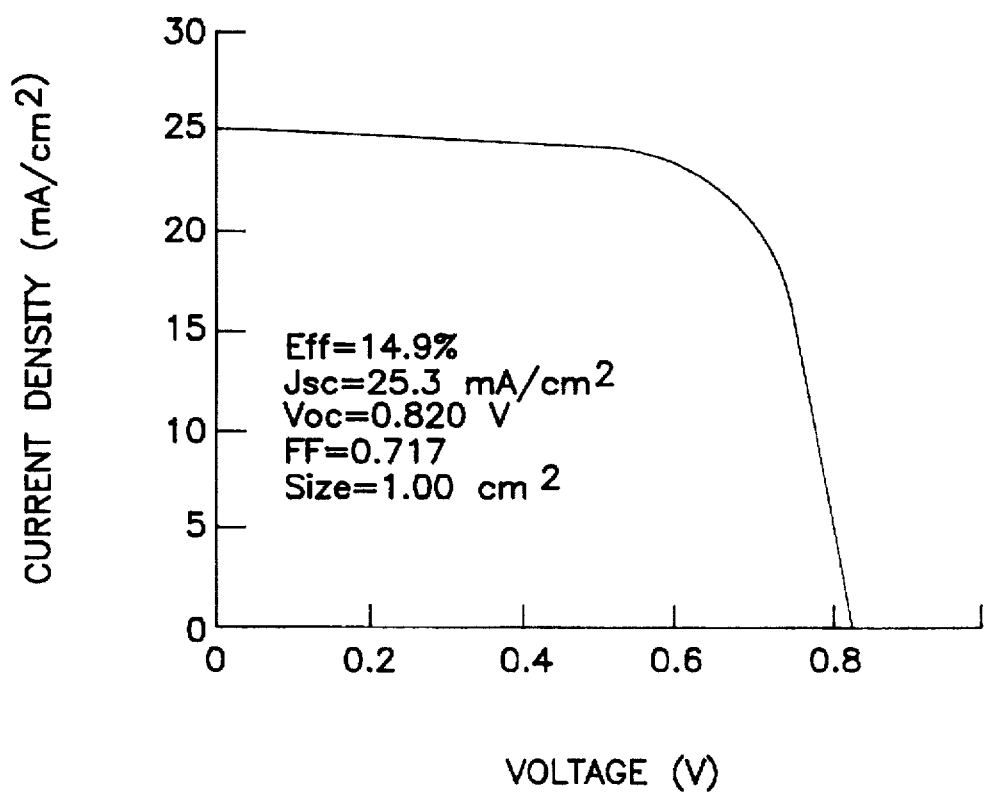
FIG. 4 is a graph showing the voltage-current characteristics of an exemplary CdS/CdTe system compound semiconductor solar cell according to the present invention.

FIG. 4 shows the measured characteristics of the completed CdS/CdTe solar cell. Excellent and highly improved characteristics showing an intrinsic photoelectric conversion efficiency of 14.9% (1.00 cm$^2$), an open voltage of 820 mV, a short circuit current density of 25.3 mA/cm$^2$, and a fill factor of 0.717 can be seen.

Figure 5:
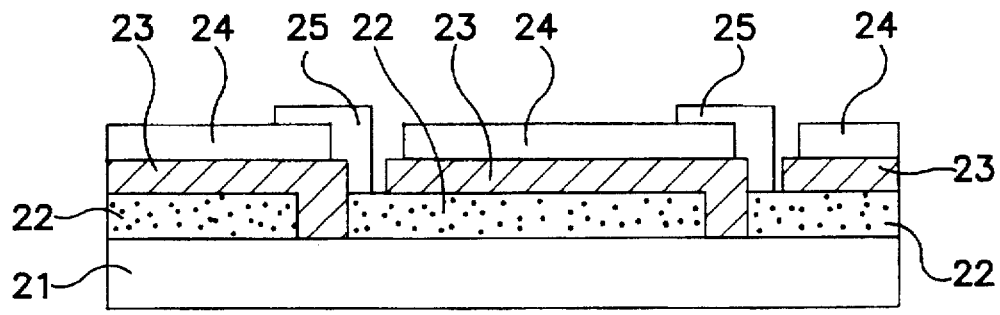
FIG. 5 is a cross-section of a CdS/CdTe system thin film compound semiconductor solar cell manufactured by a conventional printing and sintering method.

FIG. 5 shows a cross-sectional structure of a CdS/CdTe system thick film compound semiconductor solar cell manufactured by a conventional printing and sintering method. FIG. 5 shows a structure of the solar cell consisting of CdS thick film 22 disposed on barium borosilicate glass plate 21 by the printing and sintering method, CdTe thick film 23 stacked over CdS thick film 22, and sequentially deposited carbon electrode 24 and Ag-In electrode 25.

Figure 6:
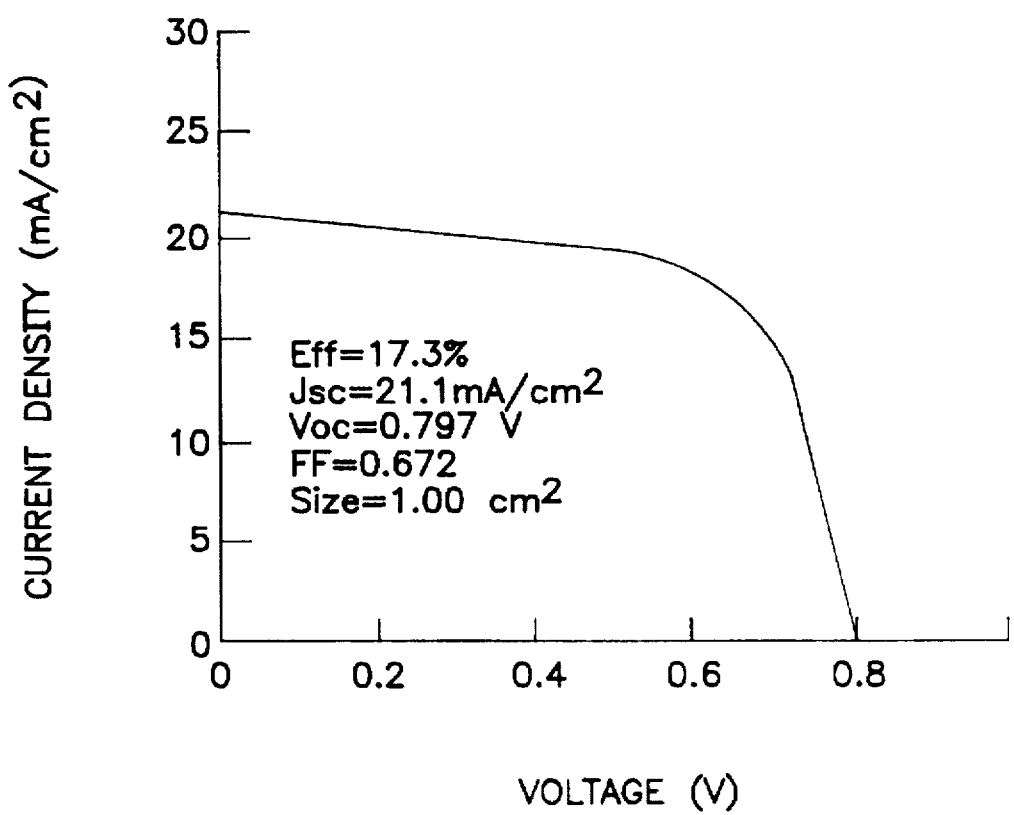
FIG. 6 is a graph showing the voltage-current characteristics of a solar cell of a conventional CdS/CdTe system thin film compound semiconductor.

FIG. 6 shows the characteristics of the thus formed solar cell. This shows that the open voltage of the same solar cell obtained by a conventional method is 797 mV, the short circuit current density is 21.1 mA/cm$^2$, the fill-factor is 0.672, and the intrinsic photoelectric conversion efficiency is 11.3% (1.00 cm$^2$).

From these results, the high conversion efficiency of a CdS/CdTe solar cell, higher by about 32% over that of a conventional solar cell, is attributed to the high shortwave light transmittance by the smaller thickness of the invented CdS thin film used as its window layer, and the low leak-current due to the high-quality and dense CdS thin film. In the CdS/CdTe system thin film compound semiconductor solar cell, not only can an ITO layer be used as the transparent conductive electrode, but a tin oxide or zinc oxide system layer can be used. However, the sheet resistance in this case should desirably be kept at a value less than 100 ohm/cm$^2$ because a sheet resistance above 100 ohm/cm$^2$ may increase the internal resistance and degenerate the photoelectric characteristics of the solar cell.

EXAMPLE-6

In this case, a 10 cm square copper plate used as a thin film forming substrate on which a CdTe thin film is deposited by a proximity sublimation method is prepared. Then, a CdS/CdTe system thin film solar cell is deposited by a method in which the process order is reversed with respect to that of the thin film deposition method shown in Example-5. Namely, in this method, a CdS thin film is deposited first on a CdTe thin film by using the method shown in Example-1, and this is followed by a deposition of a transparent conductive electrode made mainly of indium oxide. Then, a transparent silicon oxide thin film is deposited thereon for the purpose of sealing the solar cell. The characteristics of this solar cell show an open voltage of 770 mV, a short-circuit current density of 24.5 mA/cm$^2$, and an intrinsic photoelectric conversion efficiency of 12.3% (1.00 cm$^2$).

EXAMPLE-7

In this case, on a surface of the soda-lime glass used as the thin film forming substrate, a molybdenum electrode is deposited by a vacuum deposition method, and a copper-indium selenide (CIS) thin film is overlaid by a multi-element evaporation method which deposits copper, indium, and selenium simultaneously. This is followed by a deposition of a CdS thin film on this substrate by a method similar to the one shown in Example-1 except that the temperature of the thin film forming substrate is kept at 300° C. The solar cell construction process is completed by depositing the thin films of zinc oxide, ITO, and silicon oxide sequentially.

The characteristics of the constructed solar cell show an open voltage of 550 mv, a short circuit current density of 39.5 mA/cm$^2$, and an intrinsic photoelectric conversion efficiency of 11.6% (1.00 cm$^2$).

Although the thin film compound semiconductor solar cell employing the invented CdS thin film deposited by the evaporation and thermal decomposition method as its window layer has been described in Examples -5, -6 and -7, thin film compound semiconductor solar cells having characteristics nearly the same as the above can be obtained when a CdS thin film deposited by the printing and thermal decomposition method explained in Examples -3 and -4 is used as the window layer.

Moreover, since the thermal decomposition temperature of a cadmium organic compound is lower than the softening temperature of soda-lime glass, even a sheet of polyamide resin, known as heat-resistive plastic, can be used as a substrate material. A flexible solar cell applicable on a curved surface can be produced if a polyamide resin sheet is used.

Although an example in which a copper plate is used as the thin film forming substrate has been shown in Example-6, a sheet of iron or stainless steel plated with anti-corrosion and conductive metal such as copper, silver, gold, platinum, palladium, molybdenum, etc., can be used as the substrate.

Various photoelectric devices such as photoconductive devices can be obtained by using thin-films of metal sulfides such as CdS, ZnCdS, and PbS derived from the metal organic compounds by using the invented evaporation and thermal decomposition method or the printing and thermal decomposition method.

As described above in detail, the present invention eliminates the use of an expensive substrate such as the heat-resistant glass in the deposition of a metal sulfide thin film derived from a metal organic compound, as well as the use of a specially prepared inert gas atmosphere for the deposition of the thin film. Moreover, large area films can be continuously formed by using relatively low-cost equipment such as a continuous belt furnace.

Besides these many advantages, the industrial value of the present invention is very high because of the remarkably improved photoelectric conversion efficiency obtained from the thin film solar cell using a CdS thin film as its window layer over that of a conventional solar cell.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method of forming a compound semiconductor thin film on a thin film forming substrate, comprising the step of:
   thermally decomposing a sulfur-containing metal organic compound at a temperature above 300° C., said compound containing at least one functional group having at least one metal atom selected from the group consisting of copper, zinc, cadmium, mercury, and lead, said functional group also containing at least one sulfur atom.

2. A method according to claim 1, wherein said functional group also contains carbon, nitrogen, or carbon and nitrogen.

3. A method according to claim 1, wherein said metal organic compound is selected from the group consisting of mercaptide, thioate, dithioate, thiocarbonate, dithiocarbonate, trithiocarbonate, thiocarbamate, and dithiocarbamate of at least one metal element selected from the group consisting of copper, zinc, cadmium, mercury, and lead.

4. A method of forming a metal sulfide compound semiconductor thin film on a thin film forming substrate, comprising the steps of:
   volatizing a metal organic compound containing sulfur at a temperature above 300° C. from a metal organic compound supplying substrate by thermal evaporation, said metal organic compound supplying substrate having a face coated with said metal organic compound,
   depositing said metal organic compound onto said thin film forming substrate,
   thermally decomposing said deposited metal organic compound at a temperature higher than a temperature at which said thermal evaporation is performed, and
   crystallizing a thin film of said metal sulfide compound semiconductor on said thin film forming substrate.

5. A method according to claim 4, wherein at least one cadmium organic compound selected from the group consisting of cadmium mercaptide, cadmium thioate, cadmium dithioate, cadmium thiocarbonate, cadmium dithiocarbonate, cadmium trithiocarbonate, cadmium thiocarbamate, and cadmium dithiocarbamate is used as said metal organic compound.

6. A method of forming a metal sulfide compound semiconductor thin film on a thin film forming substrate, comprising the steps of:
   disposing a sulfur containing metal organic compound supplying substrate having a face coated with a sulfur containing metal organic compound at a close distance facing said thin film forming substrate,
   heating said metal organic compound supplying substrate to at least the volatization temperature of said metal organic compound to volatize and thermally evaporate said metal organic compound from said metal organic compound supplying substrate,
   depositing said metal organic compound onto said thin film forming substrate,
   thermally decomposing said deposited metal organic compound by maintaining said thin film forming substrate at least at a thermal decomposition temperature of said metal organic compound, and
   crystallizing a thin film of said metal sulfide compound semiconductor on said thin film forming substrate.

7. A method of forming a compound semiconductor thin film, comprising the steps of:
   providing a substrate,
   forming a solution by dissolving in an organic solvent at least one metal organic compound selected from the group consisting of mercaptide, thioate, dithioate, thiocarbonate, dithiocarbonate, trithiocarbonate, thiocarbamate and dithiocarbamate of a metal element selected from the group consisting of copper, zinc, cadmium, mercury, and lead,
   coating said substrate with a layer of said solution using a printing method,
   drying said layer on said substrate, and thermally decomposing said layer at a temperature above 300° C. to form said compound semiconductor thin film on said substrate.

8. A method according to claim 7, wherein at least one cadmium organic compound selected from the group consisting of mercaptide, thioate, dithioate, thiocarbonate, dithiocarbonate, trithiocarbonate, thiocarbamate, and dithiocarbamate of cadmium is used as said metal organic compound.

9. A method according to claim 7, wherein said metal organic compound dissolved in said organic solvent to form said solution is a cadmium organic compound, and the viscosity of said solution is maintained in a range of 5–100 centipoise by regulating the concentration of said cadmium organic compound in said solution within a range of 0.2–2.0 mol/l.

10. A method of manufacturing photoelectric device, comprising the steps of depositing a first electrode on an electrically insulating sheet selected from the group consisting of ceramic, glass, and resin, forming a first compound semiconductor thin film of metal sulfide on the surface of said electrode by thermally decomposing a sulfur-containing metal organic compound at a temperature above 300° C., said compound containing at least one functional group having at least one metal atom selected from the group consisting of copper, zinc, cadmium, mercury, and lead, said functional group also containing at least one sulfur atom, forming a second compound semiconductor thin film on the surface of said metal sulfide thin film using a proximity sublimation method, wherein said second compound semiconductor thin film is segmented to expose portions of said first compound semiconductor thin film, forming a second electrode of carbon on said second compound semiconductor thin film, and forming a third electrode which contacts both said first compound semiconductor thin film and said second electrode of an adjacent segment of said second compound semiconductor thin film.

11. A method according to claim 10, wherein said first and third electrodes are made from a material selected from the group consisting of copper, silver, gold, platinum, palladium, molybdenum, carbon, tin oxide, and indium-tin oxide.

12. A method of forming a compound semiconductor solar cell provided with a p-n junction, comprising the steps of:

forming a transparent conductive electrode made of indium oxide or indium-tin oxide on a transparent and electrically insulating sheet of soda-lime glass or polyamide resin, forming an n-type semiconductor window layer on the surface of said transparent conductive electrode, said n-type semiconductor window layer being a metal sulfide thin film formed by thermally decomposing a sulfur-containing metal organic compound at a temperature above 300° C., said compound containing at least one functional group having at least one metal atom selected from the group consisting of copper, zinc, cadmium, mercury, and lead, said functional group also containing at least one sulfur atom, and forming a p-type semiconductor thin film layer of cadmium telluride on said n-type semiconductor window layer.

13. A method of forming a compound semiconductor solar cell according to claim 12, wherein said metal sulfide thin film is a cadmium sulfide thin film having a thickness less than 700 nm.

14. A method of forming a compound semiconductor solar cell provided with a p-n junction, comprising the steps of:

depositing an n-type semiconductor window layer by thermally decomposing a sulfur-containing metal organic compound at a temperature above 300° C., said compound containing at least one functional group having at least one metal atom selected-from the group consisting of copper, zinc, cadmium, mercury, and lead, said functional group also containing at least one sulfur atom, onto a p-type semiconductor layer consisting of cadmium telluride or copper-indium selenide, said p-type semiconductor deposited on a surface of a metal sheet selected from the group consisting of copper, copper plated with silver, platinum, or molybdenum, iron plated with copper, silver, platinum, or molybdenum, stainless steel plated with copper, silver, platinum, or molybdenum, and an electro-insulating sheet with a conductive electrode.

15. A method of forming a compound semiconductor solar cell according to claim 14, wherein said window layer is a cadmium sulfide thin film having a thickness less than 700 nm.

* * * * *

UNITED STATES PATENT AND TRADEMARK OFFICE
CERTIFICATE OF CORRECTION

PATENT NO. : 5,714,391
DATED : February 3, 1998
INVENTOR(S) : Omura, et. al.

It is certified that error appears in the above-indentified patent and that said Letters Patent is hereby corrected as shown below:

Title page, item [73], Assignee: should read --Matsushita Battery Industrial Co., Japan--.

Signed and Sealed this

Fourth Day of August, 1998

Attest:

BRUCE LEHMAN

Attesting Officer

Commissioner of Patents and Trademarks